United States Patent [19]

Baumberger et al.

[11] Patent Number: 5,228,862
[45] Date of Patent: Jul. 20, 1993

[54] FLUID PRESSURE ACTUATED CONNECTOR

[75] Inventors: John G. Baumberger, Johnson City; James R. Petrozello, Endicott, both of N.Y.

[73] Assignee: International Business Machines Corporation, Armonk, N.Y.

[21] Appl. No.: 937,021

[22] Filed: Aug. 31, 1992

[51] Int. Cl.⁵ .......................... H01R 9/09; H01R 4/60
[52] U.S. Cl. ....................................... 439/66; 439/67; 439/77; 439/197; 439/493
[58] Field of Search ............ 439/66, 67, 77, 196–199, 439/201, 206, 493, 591

[56] References Cited

U.S. PATENT DOCUMENTS

| | | | |
|---|---|---|---|
| 3,924,915 | 12/1975 | Conrad | 439/66 |
| 4,806,104 | 2/1989 | Cabourne . | |
| 4,886,461 | 12/1989 | Smith | 439/67 |
| 5,007,842 | 4/1991 | Deak et al. . | |
| 5,061,192 | 10/1991 | Chapin et al. . | |
| 5,071,357 | 12/1991 | Van Brunt, Jr. et al. . | |
| 5,073,124 | 12/1991 | Powell | 439/197 |
| 5,102,343 | 4/1992 | Knight et al. . | |
| 5,160,296 | 11/1992 | Fox, Jr. et al. | 439/197 |

OTHER PUBLICATIONS

IBM TDB vol. 8, No. 4, Sep. 1965, pp. 518–519, "Transmission Line Connector", by Stuckert.

Primary Examiner—Paula A. Bradley
Attorney, Agent, or Firm—Lawrence R. Fraley

[57] ABSTRACT

An electrical connector for interconnecting opposed circuit members (e.g., modules, printed circuit boards) using an interim housing on which are positioned a pair of flexible circuit members which are capable of being expanded to provide desired connections. Expansion is accomplished through the application of pressurized fluid to the housing to cause expansion. Such a fluid (liquid or gas) may also cool the structure during operation. The respective conductors of the expandable flexible circuit members are electrically coupled using a common circuitized element (e.g., a thin dielectric having opposed arrays of conductive members thereon). Means for aligning the connector of the invention with the respective electrical circuit members being connected is also provided.

19 Claims, 5 Drawing Sheets

FLUID PRESSURE ACTUATED CONNECTOR

TECHNICAL FIELD

The invention relates to the field of electrical connectors for electrically interconnecting at least two electrical circuit members such as circuit modules and printed circuit boards. More particularly, the invention relates to such connectors wherein fluid pressure actuation is utilized. Even more particularly, the invention relates to such connectors which may be utilized in the information handling systems (computer) environment.

BACKGROUND OF THE INVENTION

Use of fluid pressure means in the field of electrical connectors is known, with various examples of such connectors illustrated and described in U.S. Pat. Nos. 5,071,357 and 5,102,343, both of which are assigned to the same assignee as the present invention. Typically, some type of inflatable member or the like is coupled to a suitable fluid source (hydraulic or pneumatic) which provides the needed fluid to actuate the inflatable member and cause the desired connections. Understandably, by the term fluid as used in these patents, as well as in the present specification, is meant to include both liquid and gas applications. The advantages of using such fluid pressure actuation are well known, including, particularly, uniformity of force application against the respective circuit or contact members, ease of actuation, and relatively high contact forces (if desired).

Various types of electrical interconnectors are also known in the art, including, for example, those described and illustrated in U.S. Pat. Nos. 3,796,986, 3,969,424, 4,295,700, 4,636,018, 4,688,151, 4,738,637, 4,793,814, 4,912,772, and 4,943,242. Typically, however, such interconnectors have failed to provide for high density interconnections in a sound and reliable manner, as is of course essential in the highly sophisticated information handling system field. Such connectors also typically fail to provide repeatability of connection (wherein the connector may be readily removed, and replaced and/or re-positioned, e.g., in times of repair). Such interconnectors have also, typically, been of relatively complex design and thus relatively difficult to assemble. The above disadvantages are considered particularly onerous when attempting to interconnect two separate circuit members such as a printed circuit board and a circuit module.

The connectors of U.S. Pat. Nos. 5,071,353 and 5,102,343 were designed to overcome such disadvantages while utilizing pressurized fluid as a key element in the actuating means. The present invention, as understood from the following, represents a still further improved version of such a connector and is thus deemed to constitute another advancement in this important art.

DISCLOSURE OF THE INVENTION

It is, therefore, a primary object of this invention to enhance the art of electrical connectors by providing an electrical connector for interconnecting a pair of circuit members wherein fluid pressure actuation (and the several advantages thereof) is utilized.

It is another object of the invention to provide an electrical connector of the above type which assures sound and effective connections between high density arrays of electrical contacts.

It is still another object of the invention to provide such a connector which is of relatively simple construction and which can be assembled and operated in a relatively facile manner.

It is a further object of the invention to provide such an electrical connector wherein the connections formed are readily separable.

In accordance with one aspect of the invention, there is provided an electrical connector for electrically interconnecting first and second electrical circuit members, each of the electrical circuit members including at least one conductive element. The electrical connector comprises a housing adapted for being positioned substantially between the first and second electrical circuit members and defining at least one opening therein, first and second flexible members positioned on the housing adjacent the opening and adapted for being located adjacent the first and second electrical circuit members, respectively, each of the flexible members including a dielectric member and at least one conductor adapted for being electrically coupled to the conductive element of the respective electrical circuit member when the flexible members are positioned adjacent said respective electrical circuit members. The invention further includes at least one flexible, circuitized element located substantially within the opening of the housing for being electrically coupled to the conductors of the first and second flexible members to provide an electrical connection therebetween, in addition to fluid pressure means operatively coupled to the opening within the housing for expanding the first and second flexible members when the housing is positioned between the first and second electrical circuit members and the flexible members are located adjacent the electrical circuit members, respectively. The flexible, circuitized element maintains the electrical coupling between the conductors of the first and second flexible members during the expansion.

BEST MODE FOR CARRYING OUT THE INVENTION

For a better understanding of the present invention, together with other objects, advantages and capabilities thereof, reference is made to the following disclosure in combination with the above-described drawings.

Figure 1:
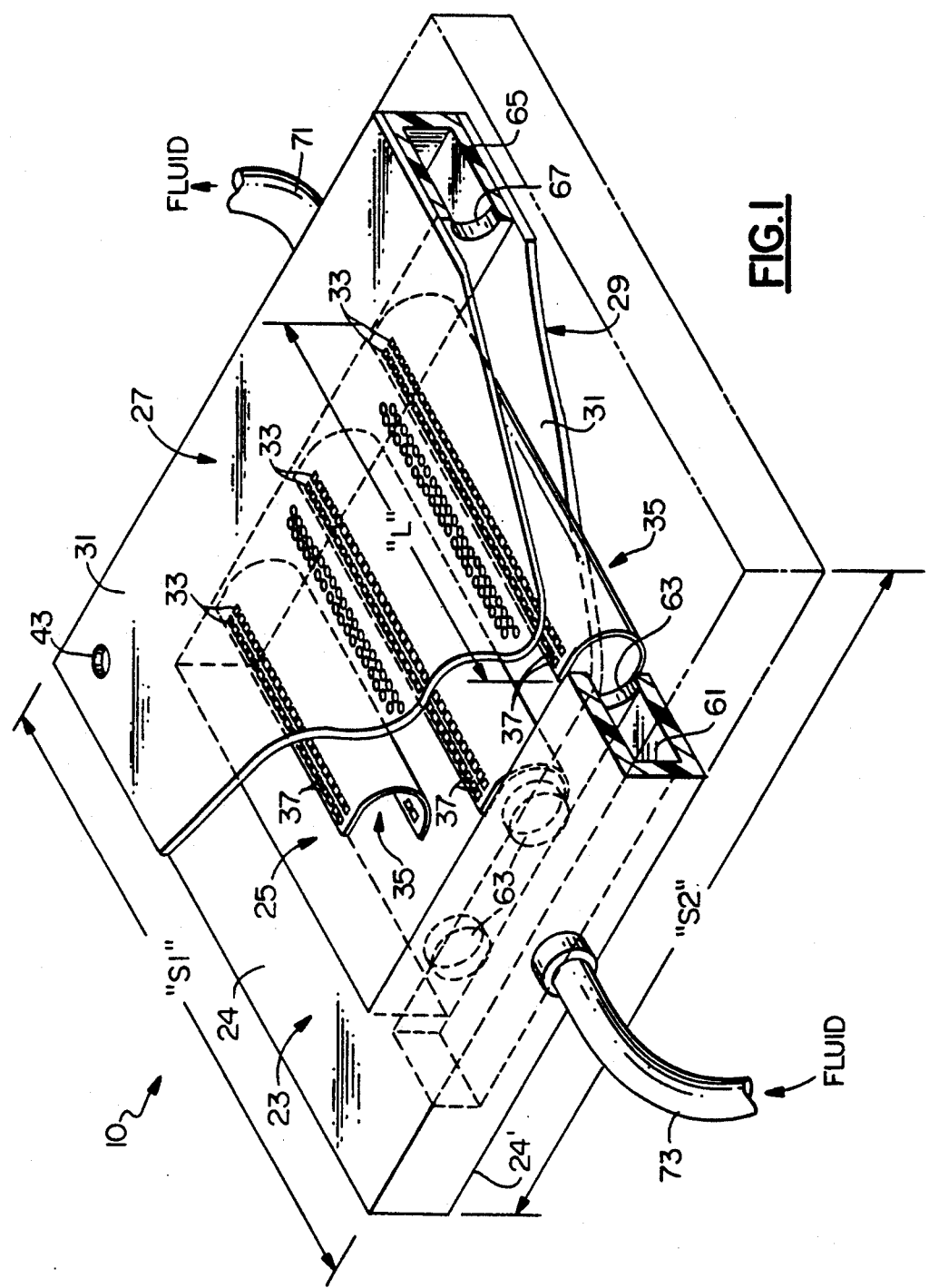
FIG. 1 is a partial, front perspective view, partly in section, of an electrical connector in accordance with one embodiment of the invention.
Figure 2:
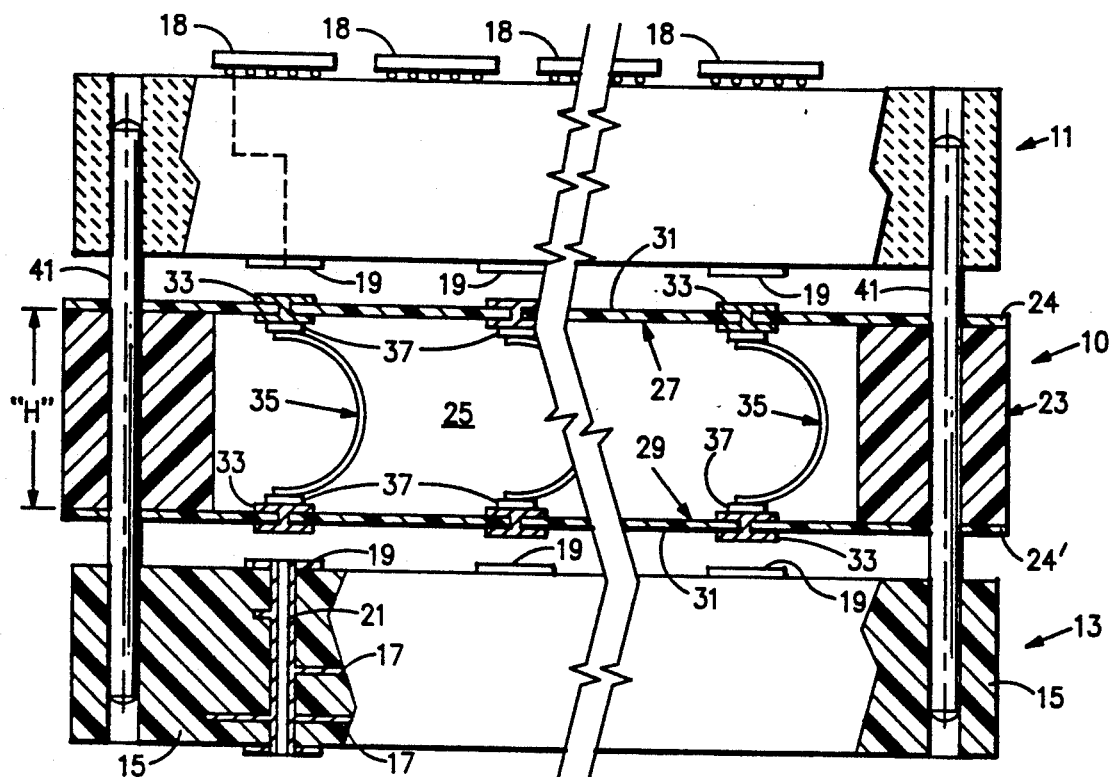
FIGS. 2 and 3 represent side views, in section and enlarged over the view of FIG. 1, showing the connector of FIG. 1 both prior to and during actuation thereof.
Figure 3:
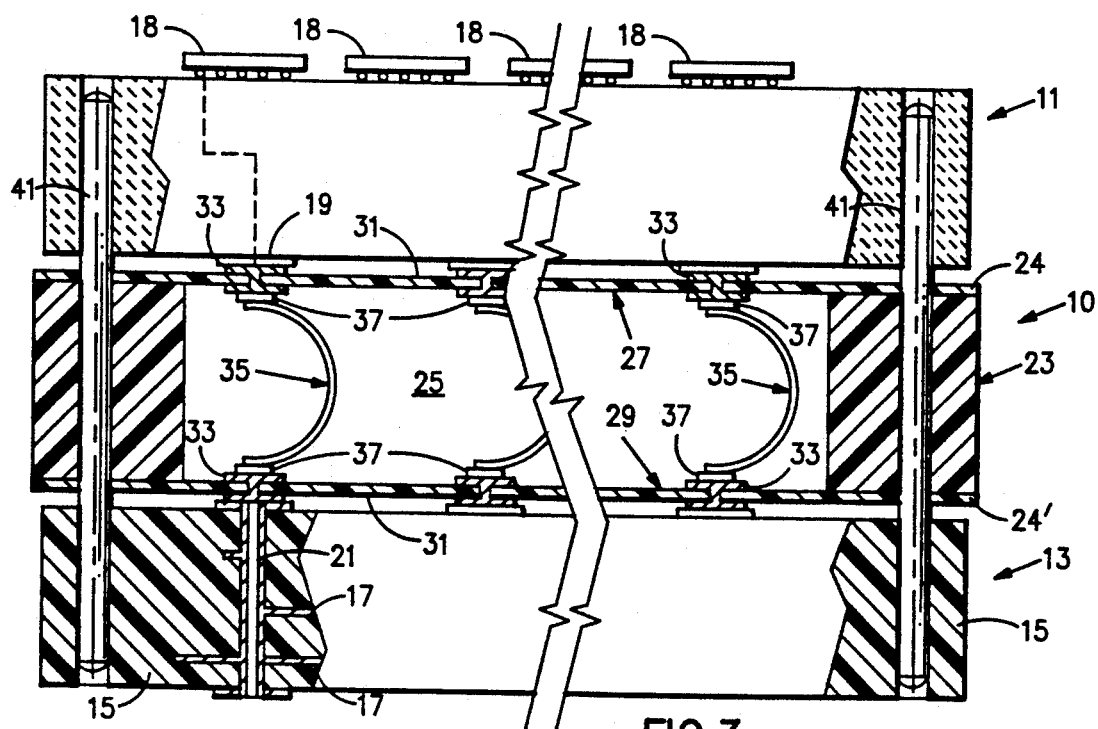

In FIG. 1, there is shown an electrical connector 10 in accordance with one embodiment of the invention. Connector 10 is designed for electrically interconnecting first and second electrical circuit members 11 and 13, as shown in FIGS. 2 and 3. Examples of such circuit members include circuit modules and printed circuit boards. By the term circuit module is meant to include a substrate or the like member having various electrical components (e.g., semiconductor chips, conductive circuitry, conductive pins, etc.) which may form part thereof. Representative examples are shown and described in U.S. Pat. Nos. 4,688,151 and 4,912,772. Further description is thus not believed necessary and the disclosures of these patents are thus incorporated herein by reference. By the term printed circuit board is meant to define a substrate including therein at least one (and, typically, several) conductive layer which in turn may provide signal, power and/or ground functions. Representative examples are shown and defined in U.S. Pat. Nos. 3,969,177, 4,515,578, 4,521,280, 4,554,405, 4,662,963, 4,700,016, 4,705,592 and 4,916,260, all of which are assigned to the assignee of the present invention. Typically, such printed circuit boards (a/k/a printed wiring boards) as used in computer products include a plurality of signal planes in combination with associated power planes located at different, designated levels within the composite structure depending on the product's operational requirements.

In FIG. 2, circuit member 11 is illustrated as a circuit module, whereas circuit member 13 is represented as a printed circuit board. This is not meant to limit the invention, however, as other circuit member combinations are readily possible. Circuit member 13, being a printed circuit board, is shown to include the aforementioned dielectric substrate 15 having therein a plurality of conductive planes (layers) 17 which function as defined above (signal, ground, and/or power). Circuit member 11, being a module, may also include semiconductor devices (chips) 18 on an opposite surface and coupled to designated elements 19.

Significantly, connector 10 is capable of providing connections between high density arrays of electrical conductive elements 19 which are formed on the facing external surfaces of members 11 and 13, respectively. By the term high density as used herein, including to define the arrays of conductors for connector 10, is means to define electrical contact pads of a sound conductive material such as copper which are of small overall size, such pads being located in close proximity to one another in accordance with a predetermined pattern. These may also include an overplate (e.g., nickel) and a precious member (e.g., gold) thereon. As an illustrated example, such elements (or pads) 19 may possess a rectangular configuration with a height (thickness) of only about 0.001 to about 0.002 inch, with side dimensions of only about 0.020 inch by about 0.020 inch. Such elements, obviously enlarged substantially in the view of FIGS. 2 and 3, may be of even smaller dimensions (e.g., about 0.012 by about 0.012 inch side dimensions). Center-to-center spacings for such elements may be only about 0.025 inch. Accordingly, a total of about 1,600 conductive elements 19 may be located on approximately one square inch of circuit member surface.

The above dimensions are, of course, not meant to limit the invention, in that connector 10 is readily capable of providing sound, effective interconnections between elements 19 of substantially larger configuration, particularly when connector 10 is to serve as a power connector. Such elements, if used in this capacity, may possess a height of about 0.001 inch to about 0.003 inch with corresponding side dimensions of about 0.040 inch and 0.040 inch, respectively. These elements, being rectangular, are preferably spaced apart at approximately 0.050 inch center-to-center dimensions.

Understandably, each conductive element 19 may in turn be electrically connected to internal circuitry and/or components within the circuit member's substrate. By way of example, the element 19 of circuit member 13 illustrated to the far left in FIG. 2 is shown as being electrically coupled to selective ones of the internal conductive layers 17 through a conductive aperture (a/k/a a plated through hole) 21. Additionally, elements 19 may also be electrically connected to external circuitry located on the respective facing surfaces occupied by these segments. Such circuitry is not shown, for illustration purposes.

Connector 10 includes a housing 23 adapted for being positioned substantially between circuit members 11 and 13. Housing 23 is preferably of electrically insulative material, e.g., plastic, with suitable examples being polyphenylene sulfide and polyphenylene oxide. In one example of the invention, housing 23 preferably possesses an overall height (thickness) of about 0.200 inch, said height dimension represented by the letter "H" in FIG. 2. Housing 23, as further illustrated in FIG. 1, is also preferably of rectangular configuration with side dimensions ("S1", "S2") of about 5.0 inch and about 5.0 inch, respectively. Housing 23 is thus preferably of substantially rectangular, box-like configuration with substantially planar upper and lower external surfaces (24, 24') for respective aligning with the facing, external surfaces of circuit members 11 and 13 and for being positioned adjacent thereto.

As shown in FIGS. 1–3, housing 23 also defines a relatively large, central opening 25 therein, this opening being surrounded by the housing's four sides and opened (accessed to) the upper and lower surfaces of the housing. Opening 23 is thus rectangular, but of course not limited to this particular shape.

Located on the top and bottom surfaces of housing 23 are a pair of flexible members 27 and 29, each of these members including a thin dielectric member 31 which, as shown, bridges across the exposed open part of opening 25 to thus provide a cover therefor. Additionally, each flexible member further includes at least one conductor 33 therein, which conductor in one embodiment of the invention preferably includes two opposing surfaces (described better in FIG. 4 below), one of which is adapted for engaging a respective conductive element 19 when connector 10 is aligned with and thus positioned between the two circuit members 11 and 13. Additionally, the opposing surface of each conductor 33 is adapted for being electrically coupled to a flexible, circuitized element 35 (described below) such that the flexible, circuitized element thus provides an electrical interconnection between respective pairs of conductors on the upper and lower circuit members 27 and 29.

Significantly, the dielectric members 31 of each flexible member are sealingly located on the planar, outer surfaces of the rectangular housing so as to provide an effective seal therewith. Such a seal enables outward expansion of these flexible members when pressurized fluid is applied to the invention, e.g., in the manner defined hereinbelow. Such a seal is deemed critical to the successful operation of the invention and is preferably provided using a suitable adhesive on the housing's respective outer surfaces and bonding the outer portion of the dielectric members 31 thereto. Such a positioning relationship, in partial form, is shown in the perspective view of FIG. 1.

Figure 4:
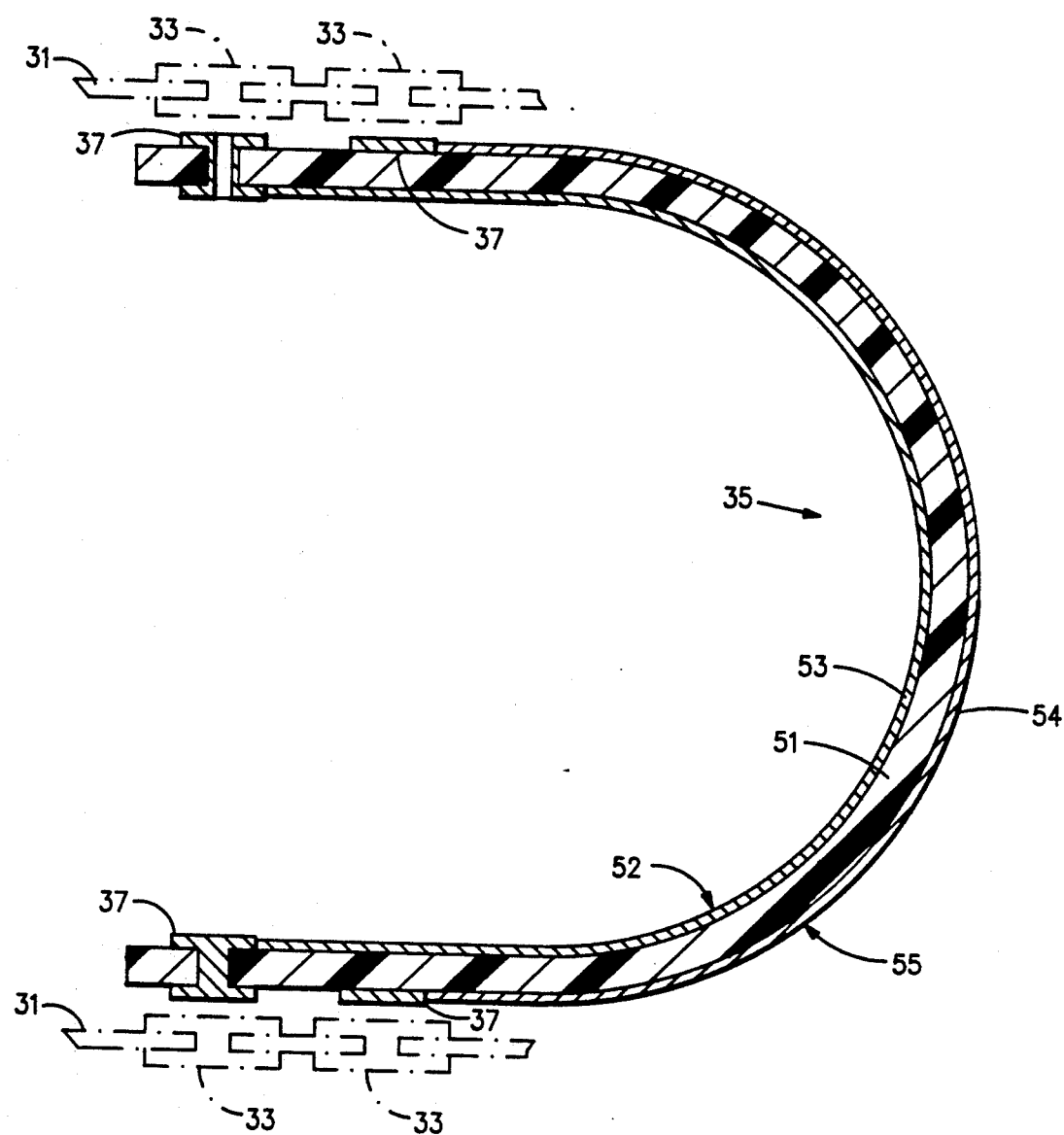
FIG. 4 is a much enlarged view, in section, of one embodiment of a flexible circuitized element suitable for use in the present invention.

As also seen in FIG. 1, a plurality of circuitized elements 35 are preferably utilized to in turn provide electrical interconnection between respective, dual rows of both upper and lower arrays of conductors 33 located on flexible members 27 and 29. Accordingly, the respective ends of each element 35 preferably include a similarly configured array of conductive members 37 (also described in greater detail hereinbelow with respect to FIG. 4). As best seen in FIGS. 1 and 4, these dual rows of conductive members 37 align with and respectively coupled to a similar pattern of the defined conductors 33. (It must be mentioned that only a singular row of conductive members 37 and respective conductors 33 is shown in FIGS. 2 and 3 for each of the respective ends of the interim flexible, circuitized elements 35, this being done for illustration purposes). Although two parallel rows of conductive members and corresponding conductors are shown in FIG. 1, and further defined in FIGS. 4 and 5 below, it is understood that the invention is not to be limited to such arrays. Accordingly, only a singular row of each is possible within the scope of the invention.

As stated, each of the defined flexible members 27 and 29 is sealed to a respective outer surface (24 and 24', respectively) of housing 23. Thus, each flexible member is located immediately adjacent (and thus facing) the corresponding pattern of conductive elements 19 on the respective circuit member (11, 13) located adjacent thereto when the connector 10 is in final operating position (FIG. 3). Such alignment is accomplished, as shown in FIGS. 2 and 3, using at least two elongated pins 41 which pass substantially through the entire thickness of housing 23 at spaced apart locations therein and are adapted for being positioned within the respective first and second circuit members 11 and 13. In a preferred embodiment, each of the elongated pins was comprised of stainless steel, although other materials are of course acceptable for this purpose. Pins 41 may be initially positioned within one of the circuit members (e.g., 15) and connector 10 then located thereon. Thereafter, the remaining circuit member will be positioned on the projecting upper end portions of the pins which pass through housing 23. Alternatively, pins 41 may be securely positioned within housing 23 (e.g., using an adhesive) so as to project externally thereof such that each of the respective circuit members may be positioned thereon. In FIG. 1, an aperture 43 is shown and used for this purpose (to have a pin 41 pass therethrough). In a preferred embodiment, a total of two such pins 41 are utilized, although others (e.g., four) may be successfully used. Pins 41 thus serve to precisely align the respective circuit members with the interim connector.

Figure 5:
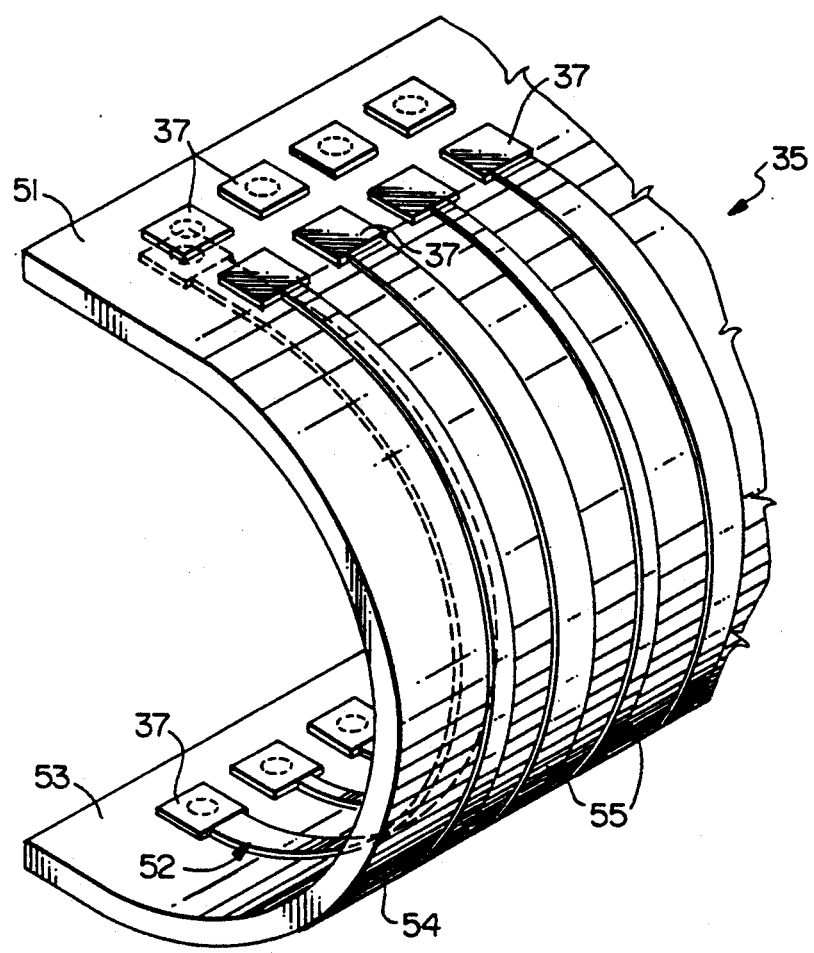
FIG. 5 is a partial perspective view, on a reduced scale, of the element of 4.

In FIGS. 4 and 5, there are provided much enlarged views of a flexible, circuitized element 35 for preferred use in the present invention. It is to be understood, however, that the invention is not limited to the particular construction shown in these views. Understandably, the purpose of element 35 is to provide a positive electrical connection between respective pairs of conductors of the invention's flexible members both when connector 10 is an unactuated state (FIG. 2) as well as when the connector is actuated (e.g., FIG. 3) through the application of an appropriate pressurized fluid (described in greater detail hereinbelow). A key feature of each of the elements 35 used herein is the ability to allow outward expansion of the respective flexible members during connector actuation while still maintaining such a positive interconnection therebetween. Because such interconnections may be subject to relatively high pressures during such fluid application, the elements of the present invention must be of sufficient strength so as to withstand such pressures.

In FIG. 4, element 35 is shown to include a thin, dielectric element 51 which, as better seen in FIG. 5, is of elongated configuration so as to include a plurality of the aforementioned conductive members 37 spacedly positioned thereon in accordance with a predetermined pattern. Again, it is noted that the pattern of such conductive members 37 differs from the much smaller (in scale) embodiment depicted in FIGS. 2 and 3, this dual row of such conductive members not shown therein for illustration purposes. Thin dielectric element 51 is preferably polyimide, having a thickness of about 0.001 inch and, in one embodiment of the invention, possessed an overall length (dimension "L" in FIG. 1) of about 4" to 5" inch and a corresponding width of about 0.050 to 0.100 inch. Each conductive member is preferably copper and, as shown in FIG. 5, may be of two different constructions. Specifically, one version of such a conductive member may extend through the thin dielectric 51, such that the circuitry 52 used to interconnect respective pairs of such members may be located on an internal surface 53 of the dielectric. Such through type conductive members are shown to the left in FIG. 4, the member in the lower part of this FIG. being of solid metallic construction while the corresponding upper, paired member 37 includes an aperture therein (e.g., so as to accept a male pin or the like (not shown)) if such a member is utilized for the conductor 33 of one of the respective flexible members (27, 29). Such an aperture may also serve to facilitate solder placement and reflow to form the desired connection at this location. Alternatively, the conductive members may be in the form of relatively flat metallic pads located on the outer surface 54 of dielectric 51 and interconnected by circuitry 55 which, as shown in FIG. 4, passes along this outer surface to provide interconnection between the respective, pairs of such flat conductive members. Circuitry 55 is better seen in FIG. 5. This circuitry, like that circuitry (52) used on the internal surface 53, is preferably of known material, e.g., copper, and may be applied using known techniques in the art. Further, each of the described conductive members may also be applied to dielectric 51 using known techniques (e.g., photolithography).

Although in FIGS. 4 and 5 it is shown to connect respective pairs of through type conductive members with each other, as well as to connect respective flat pad type conductive members with each other, it is understood that the invention is not limited to this combination in that others (e.g., a flat pad to a through member) are readily possible. The present invention thus enables the dual option of both internal and external circuitry to assure interconnections between patterns of conductive members of relatively high density.

Each of the conductive members 37 is permanently coupled (e.g., soldered) to the respective conductor 33 to thus assure a permanent type connection during operation of connector 10. Such connections may be formed using techniques known in the art and further description is not believed necessary. In a preferred embodiment of the invention, a total of 60 circuitized elements 35 were utilized.

As stated, alternative constructions for the circuitized elements illustrated herein are readily possible. In a simplest form, for example, a singular conductive wire (e.g., copper), suitably coupled (e.g., soldered) at opposing ends thereof to the respective pairs of conductors 33 desired for interconnection, may be utilized. To prevent possible shorting of this wire with other wires, if used in the invention, a suitable dielectric coating or the like may be applied to designated portions between the terminal ends of the wire, one example of such a coating being polyimide. Other alternative constructions are well within the scope of those skilled in the art.

Expansion of the invention's flexible members 27 and 29 is accomplished through the application of pressurized fluid to housing 23 such that this fluid will pass into central opening 25 and impinge against the internal surfaces of these flexible members. As shown in FIG. 1, such fluid may be supplied to a manifold portion 61 located along one of the longitudinal sides of the housing and thereafter pass into central opening 25, e.g., through a plurality of respective apertures 63. Such fluid will then preferably exit central opening 25, e.g., through a second manifold portion 65 located on an opposite side of housing 23, this preferably achieved by passing the fluid through corresponding apertures 67 (only one shown) similar to apertures 63 and located on the internal wall of the opposing manifold portion. Preferably, an aperture 63 is provided adjacent (and thus relative to) a respective one of each of the circuitized elements 35, as shown in FIG. 1. Further, should exit apertures 67 be utilized, it is also preferred that one of these apertures be also located adjacent the opposite end of each circuitized element 35, to thereby facilitate fluid flow. Exit of fluid from housing 23 can be provided by a suitable pipe 71 or the like, this pipe connected to the opposing manifold portion 65 similarly to the connection of an input pipe 73 as may be used to provide incoming fluid through manifold portion 61. Such connections are well within the scope of those skilled in the art and further description is not believed necessary.

In a preferred embodiment of this invention, a preferred fluid is a miscible, high density, high molecular weight, colorless perfluorinated liquid currently available under the product name Fluorinert, from the Minnesota Mining and Manufacturing Company. (Fluorinert is a trademark of this company.) This liquid, one example referred to as FC-77, may be utilized and preferred because of its non-contaminating nature, in addition to the fact that it is substantially non-compressible and thus capable of being loaded to relatively high pressures. Should a liquid be used for this purpose, suitable valving and/or metering units (not shown) would be utilized as part of the fluid supply means for the invention. Additionally, a pump (not shown) or the like would also be utilized. Other fluids suitable for use in the present invention include air or other gases (e.g., $CO_2$), as well as other liquids (e.g., nitrogen). By the term fluid as used herein is thus meant to include both liquids and gases. In one example, a fluid was applied at a pressure within the range of from about 30 to about 50 pounds per square inch to the manifold portion 61.

Significantly, use of a liquid or other fluids such as described above allows for the simultaneous cooling of the invention during fluid application. Fluorinert has proven particularly acceptable for this purpose. Such a feature (cooling) is deemed particularly significant when coupling relatively highly dense patterns of conductors wherein heat generation is likely. This is particularly true when such interconnections are of the power type, as often used and required in the information handling systems field. Use of a cooling fluid would further require that the fluid be circulated, preferably using a closed loop system, through suitable cooling means, e.g., heat exchanger, prior to return thereof to the invention. Such additional structure is well within the knowledge of those skilled in the art and further description is not believed necessary.

Figure 6:
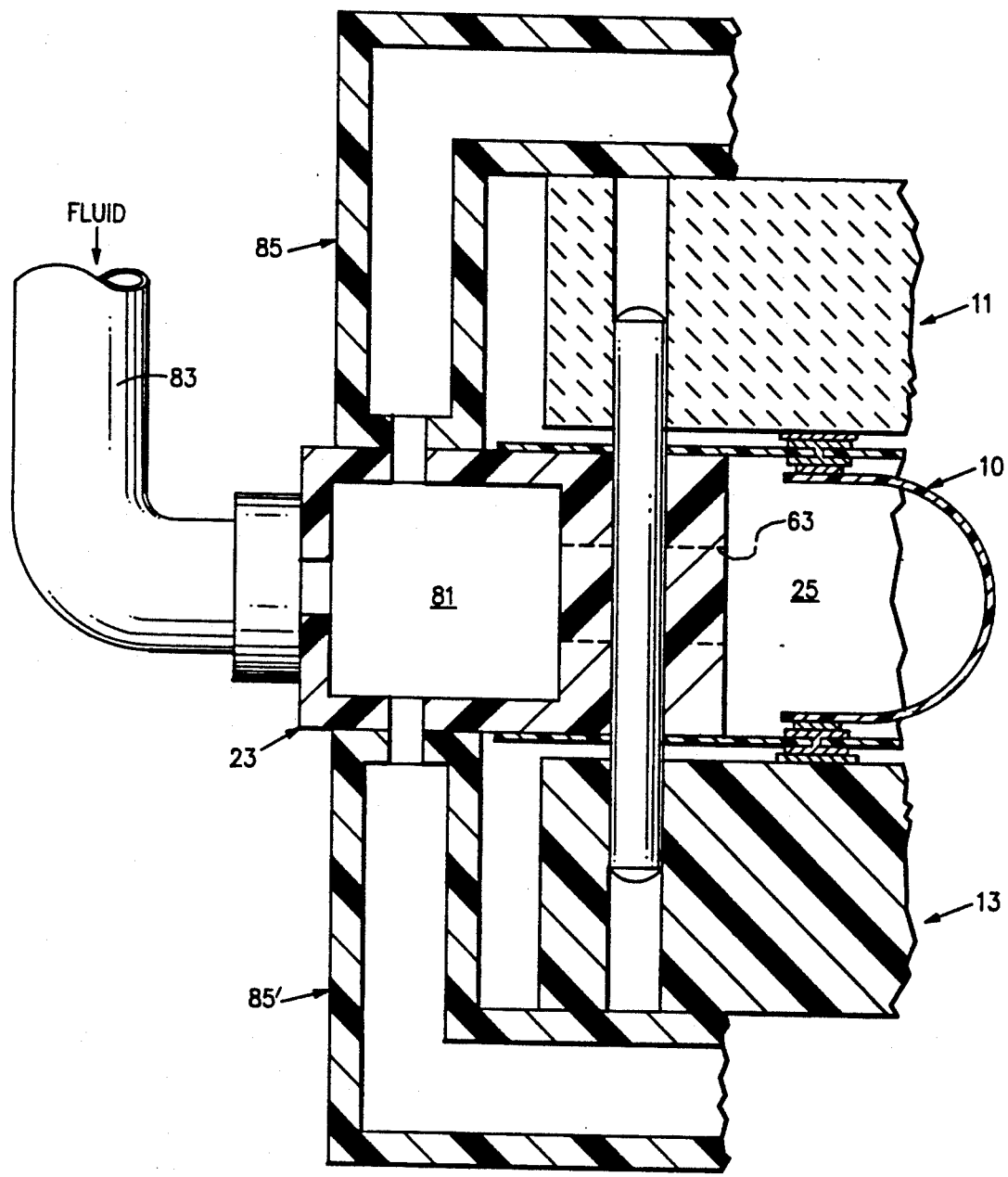
FIG. 6 is a side elevational view, in section and on a much enlarged scale, of one embodiment of a cooling means for cooling two circuit members connected using the present invention.

In FIG. 6 there is shown an alternative embodiment of the invention wherein enhanced cooling is possible. It is understood that this alternative embodiment is particularly useful when providing connections of the power type between circuit members such as those described herein (e.g., modules and circuit boards). In FIG. 6, connector 10 is shown in position between two members 11 and 13, similar to those in FIGS. 2 and 3. Further description is not believed necessary. In FIG. 6, housing 23 has been modified to include a common manifold 81 within at least one side thereof, which common manifold is operatively coupled (using a connecting pipe 83 or the like) which in turn is coupled to the designated fluid source. Cooling fluid passing into common manifold 81 is then passed outwardly to a pair of cooling elements 85 and 85' which, as shown, physically engage the respective circuit members 11 and 13, respectively. Each such manifold cooling element is preferably of suitable plastic material (e.g., of the types described above for housing 23) and may be attached to the common housing using suitable means (e.g., clamps) not shown. Additionally, cooling fluid supplied to common manifold 81 may also pass inwardly to the housing's common, central opening 25 in a manner similar to that shown in FIG. 1 (through aperture 63). Such apertures may be located within a separate internal side wall of housing 23 from that of common manifold 81, provided the manifold has access thereto. Such modifications are of course within the scope of the invention. Recirculation means similar to that used in the embodiment of FIG. 1 may be also readily used with minor modifications required. As shown, two cooling elements are preferably utilized, one for each of the respective electrical circuit members used.

Use of the present invention may be extended to provide even greater connecting capabilities and thus even further enhance the state of the art. For example, it is possible to couple the connector of the present invention to opposite sides of a common, large circuit board, with each such connector in turn having yet another circuit member located on the opposite side thereof. Accordingly, two connectors of the present invention would be utilized to couple a pair of such external electrical circuit members to a common circuit board. Alignment with this common board may be similar to that shown herein (e.g., suitable pins or the like). Alternatively, a suitable retention means (e.g., clamps) may be utilized to retain the respective, external electrical circuit members in position against the respective, interim connectors. It is also understood that even further enhancements using the unique teachings of the present invention are possible and within the scope of this invention.

Thus there has been shown and described an electrical connector which serves to effectively interconnect a pair of opposed electrical circuit members in a new and unique manner, using the several advantages of fluid pressure. The connector as described herein includes two, outer pliable flexible members for providing connections to such external circuit members and is thus also able to compensate for non-planarity thereof, as well as that of the several conductive elements used as part of such electrical circuit members. The invention as defined is thus able to achieve uniform applications of force on each interconnection in a positive, effective manner. Further, the invention as defined herein is capable of being assembled using processes and materials known in the art.

While there have been shown and described what are at present considered the preferred embodiments of the invention, it will obvious to those skilled in the art that various changes and modifications may be made therein without departing from the scope of the invention as defined by the appended claims.

What is claimed is:

1. An electrical connector for electrically interconnecting first and second electrical circuit members, each of said electrical circuit members including at least one conductive element, said electrical connector comprising:
   a housing adapted for being positioned substantially between said first and second electrical circuit members and defining at least one opening therein;
   first and second flexible members positioned on said housing adjacent said opening and adapted for being located adjacent said first and second electrical circuit members, respectively, each of said flexible members including a dielectric member and at least one conductor adapted for being electrically coupled to said conductive element of said respective electrical circuit member when said flexible members are positioned adjacent said respective electrical circuit members;
   at least one flexible, circuitized element located substantially within said opening of said housing and being electrically coupled to said conductors of said first and second flexible members to provide an electrical connection therebetween; and
   fluid pressure means operatively coupled to said opening within said housing for expanding said first and second flexible members when said housing is positioned between said first and second electrical circuit members and said flexible members are located adjacent said electrical circuit members, respectively, said flexible, circuitized element maintaining said electrical coupling between said conductors of said first and second flexible members during said expansion.

2. The electrical connector according to claim 1 wherein said first electrical circuit member comprises a circuit module and said second electrical circuit member comprises a printed circuit board.

3. The electrical connector according to claim 3 wherein said housing is electrically insulative.

4. The electrical connector according to claim 3 wherein said housing is plastic.

5. The electrical connector according to claim 1 wherein said housing includes first and second opposing sides defining said opening substantially therebetween, said first and second flexible members being secured to said first and second opposing sides, respectively, and substantially bridging said opening.

6. The electrical connector according to claim 5 wherein each of said flexible members provides a seal for said opening along said respective side of said housing.

7. The electrical connector according to claim 6 wherein each of said conductors of said first and second flexible members extends through said dielectric, each of said conductors having a first surface for being coupled to said respective conductive element and a second surface for being coupled to said flexible circuitized element.

8. The electrical connector according to claim 1 wherein said flexible circuitized element comprises a thin, dielectric element having conductive members at opposed ends thereof and electrical circuitry electrically connecting said conductive members.

9. The electrical connector according to claim 8 wherein said dielectric element is comprised of polyimide and each of said conductive members is comprised of copper.

10. The electrical connector according to claim 8 wherein each of said conductive members located at opposed ends of said thin, dielectric element is permanently attached to said respective conductor of said flexible member.

11. The electrical connector according to claim 10 wherein each of said conductive members is soldered to said respective conductor of said flexible member.

12. The electrical connector according to claim 1 further including means for aligning said housing relative to said first and second electrical circuit members.

13. The electrical connector according to claim 12 wherein said means for aligning said housing comprises at least two elongated pins passing substantially through said housing at spaced apart locations therein and adapted for being positioned within said first and second electrical circuit members.

14. The electrical connector according to claim 1 wherein said fluid pressure means further provides cooling fluid to said opening within said housing to provide cooling of said first and second flexible members during said expansion of said flexible members and during operation of said connector.

15. The electrical connector according to claim 14 wherein said cooling fluid comprises a perfluorinated liquid.

16. The electrical connector according to claim 14 wherein said cooling fluid is provided said housing at a pressure within the range of from about 30 pounds per square inch to about 50 pounds per square inch.

17. The electrical connector according to claim 14 wherein said housing includes at least one manifold portion therein having access to said opening within said housing, said fluid pressure means being connected to said manifold portion to provide fluid thereto.

18. The electrical connector according to claim 1 further including at least one manifold cooling element coupled to said housing and located in physical contact with a respective one of said electrical circuit members for providing cooling thereof, said fluid pressure means operatively coupled to said manifold cooling element for providing cooling fluid thereto to enable said manifold cooling element to provide said cooling of said electrical circuit member.

19. The electrical connector according to claim 18 wherein the number of manifold cooling elements is two.

* * * * *